United States Patent
Park et al.

(10) Patent No.: US 10,467,091 B2
(45) Date of Patent: Nov. 5, 2019

(54) MEMORY MODULE, MEMORY SYSTEM INCLUDING THE SAME, AND ERROR CORRECTING METHOD THEREOF

(71) Applicant: SK hynix Inc., Gyeonggi-do (KR)

(72) Inventors: Jong-Hyun Park, Gyeonggi-do (KR); Sung-Eun Lee, Gyeonggi-do (KR); Ja-Hyun Koo, Gyeonggi-do (KR); Seung-Gyu Jeong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 85 days.

(21) Appl. No.: 15/689,263

(22) Filed: Aug. 29, 2017

(65) Prior Publication Data

US 2018/0217894 A1   Aug. 2, 2018

(30) Foreign Application Priority Data

Jan. 31, 2017   (KR) .................. 10-2017-0013769

(51) Int. Cl.
| | |
|---|---|
| G06F 11/00 | (2006.01) |
| G06F 11/10 | (2006.01) |
| H03M 13/15 | (2006.01) |
| G11C 7/10 | (2006.01) |
| G11B 20/18 | (2006.01) |
| G11C 11/4078 | (2006.01) |
| G11C 11/56 | (2006.01) |

(Continued)

(52) U.S. Cl.
CPC ...... *G06F 11/1056* (2013.01); *G06F 11/1048* (2013.01); *G11B 20/1833* (2013.01); *G11C 7/1006* (2013.01); *G11C 11/4078* (2013.01); *G11C 11/5628* (2013.01); *G11C 29/42* (2013.01); *G11C 29/4401* (2013.01); *G11C 29/52* (2013.01); *H03M 13/1515* (2013.01); *G11C 5/04* (2013.01); *G11C 2029/0411* (2013.01)

(58) Field of Classification Search
None
See application file for complete search history.

(56) References Cited

U.S. PATENT DOCUMENTS

| | | | |
|---|---|---|---|
| 7,328,380 B2* | 2/2008 | Pomaranski | G06F 11/106 365/185.09 |
| 8,041,989 B2* | 10/2011 | Lastras-Montano | G06F 11/1044 714/42 |

(Continued)

FOREIGN PATENT DOCUMENTS

KR   1020160007440   1/2016

*Primary Examiner* — Daniel F. McMahon
(74) *Attorney, Agent, or Firm* — IP & T Group LLP

(57) ABSTRACT

An error correcting method of a memory system includes: reading read data and an error correction code from a plurality of memory chips; correcting an error of the read data using the error correction code; temporarily storing the read data and the error correction code in a buffer when the correcting of the error fails; writing a certain input test pattern in the plurality of memory chips, reading an output test pattern written in the plurality of memory chips, and detecting a fail chip in which a chipkill occurs; recorrecting, based on a location of the detected fail chip, the error of the read data stored in the buffer using the error correction code stored in the buffer; and rewriting error-corrected read data and the error correction code in the plurality of memory chips.

20 Claims, 5 Drawing Sheets

(51) Int. Cl.
  *G11C 29/52* (2006.01)
  *G11C 29/42* (2006.01)
  *G11C 29/44* (2006.01)
  *G11C 5/04* (2006.01)
  *G11C 29/04* (2006.01)

(56) References Cited

U.S. PATENT DOCUMENTS

| | | | | |
|---|---|---|---|---|
| 2008/0010435 | A1* | 1/2008 | Smith | G06F 11/1076 |
| | | | | 712/10 |
| 2008/0195902 | A1* | 8/2008 | Astigarraga | G11C 29/24 |
| | | | | 714/720 |
| 2010/0299576 | A1* | 11/2010 | Baysah | G06F 11/1044 |
| | | | | 714/763 |
| 2013/0326293 | A1* | 12/2013 | Muralimanohar | G11C 29/08 |
| | | | | 714/718 |
| 2014/0192583 | A1* | 7/2014 | Rajan | G11C 7/10 |
| | | | | 365/63 |

\* cited by examiner

MEMORY MODULE, MEMORY SYSTEM INCLUDING THE SAME, AND ERROR CORRECTING METHOD THEREOF

CROSS-REFERENCE TO RELATED APPLICATION

This application claims priority under 35 U.S.C. § 119 to Korean Patent Application No. 10-2017-0013769, filed on Jan. 31, 2017 in the Korean Intellectual Property Office, the disclosure of which is incorporated herein by reference in its entirety.

TECHNICAL FIELD

Exemplary embodiments of the present disclosure relate to a semiconductor design technology and, more particularly, to a memory module, a memory system including the same and an error correcting method thereof.

DISCUSSION OF THE RELATED ART

In the early years of the semiconductor memory industry, a large number of original good dies in which there is no defective memory cell in memory chips that have passed through a semiconductor manufacturing process, have been distributed on each wafer. However, as the capacities of memory devices have gradually increased, it has become increasingly more difficult to manufacture a memory device having no defective memory cells. At present, there is very little probability of success of manufacturing such a memory device.

In an effort to overcome defective cell problems, a technique of repairing defective memory cells of a memory device using redundancy memory cells has been used. In another effort, an error correction (ECC) circuit of correcting an error in a memory system has been used to correct errors occurring in memory cells, or during data transmission in a read or write operation of the memory system.

SUMMARY

Various embodiments of the present invention are directed to a memory module, a memory system including the memory module and an operating method thereof capable of enhancing the efficiency in error correction.

In an embodiment, an error correcting method of a memory system may include: reading read data and an error correction code from a plurality of memory chips; correcting an error of the read data using the error correction code; temporarily storing the read data and the error correction code in a buffer when the correcting of the error fails; writing a certain input test pattern in the plurality of memory chips, reading an output test pattern written in the plurality of memory chips, and detecting a fail chip in which a chipkill occurs; recorrecting, based on a location of the detected fail chip, the error of the read data stored in the buffer using the error correction code stored in the buffer; and rewriting error-corrected read data and the error correction code in the plurality of memory chips.

In an embodiment, a memory system may include: a plurality of memory chips suitable for storing data and an error correction code; an error correction circuit suitable for correcting an error of the data read from the plurality of memory chips using the error correction code read from the plurality of memory chips, and temporarily storing the read data and the error correction code in a buffer when the correction of the error fails; and a fail chip detection circuit suitable for writing a certain input test pattern in the plurality of memory chips, reading an output test pattern written in the plurality of memory chips, and detecting a fail chip in which a chipkill occurs, when the correction of the error fails, wherein the error correction circuit recorrects, based on a location of the detected fail chip, the error of the read data stored in the buffer using the error correction code stored in the buffer, and rewrites error-corrected read data and the error correction code in the plurality of memory chips.

In an embodiment, a memory module may include: a plurality of memory chips suitable for storing data and an error correction code; an error correction circuit suitable for correcting an error of the data read from the plurality of memory chips using the error correction code read from the plurality of memory chips, and temporarily storing the read data and the error correction code in a buffer when the correction of the error fails; and a fail chip detection circuit suitable for writing a certain input test pattern in the plurality of memory chips, reading an output test pattern written in the plurality of memory chips, and detecting a fail chip in which a chipkill occurs, when the correction of the error falls, wherein the error correction circuit recorrects, based on a location of the detected fail chip, the error of the read data stored in the buffer using the error correction code stored in the buffer, and rewrites error-corrected read data and the error correction code in the plurality of memory chips.

DETAILED DESCRIPTION

Figure 1:
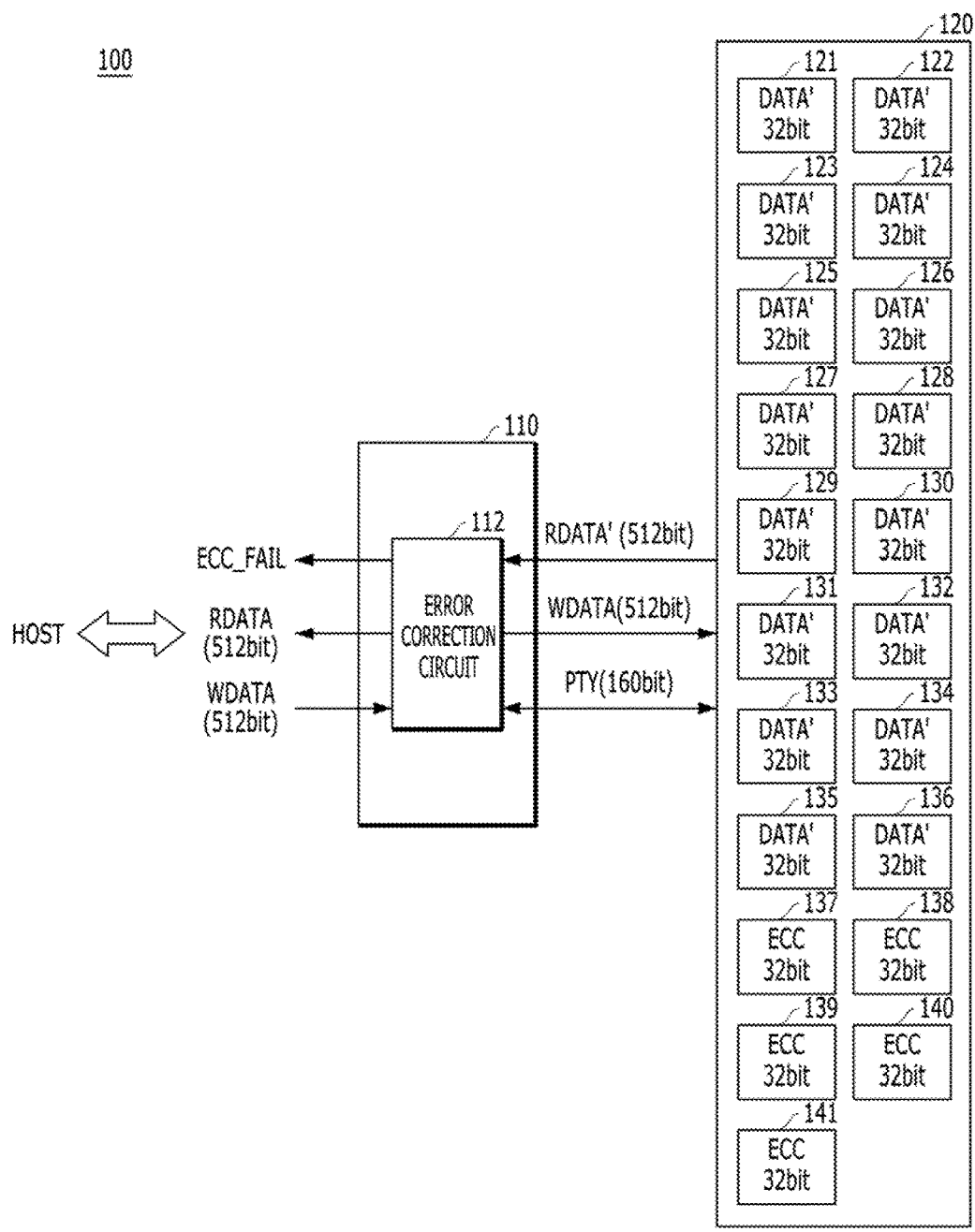
FIG. 1 is a block diagram illustrating a memory system.

Various embodiments will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

In a memory system having a low error rate, a random error which is randomly caused in a memory device may be processed by an ECC circuit provided in the memory device, and an ECC circuit provided in a memory controller may perform only a comparatively simple error correction operation such as a single error correction/double error detection (SEC/DED) operation in which a 1-bit error is corrected and a 2-bit error is detected, taking into account only a chipkill error.

However, as the degree of integration of memory devices is increased, multi-bit error occurrence probability is increased. Therefore, random errors may be frequently caused. Therefore, the ECC circuit provided in the memory controller should be able to process both the chipkill error and the random error.

FIG. 1 is a block diagram illustrating a memory system 100.

In FIG. 1, there is illustrated only a portion of the memory system 100 which directly pertains to data transmission.

Referring to FIG. 1, the memory system 100 may include a memory controller 110 and a memory module 120. The memory controller 110 may control an operation such as a read or write operation of the memory module 120 in response to a request received from a host HOST.

The memory controller 110 may include an error correction circuit 112.

The error correction circuit 112 may receive write data WDATA transmitted from the host HOST during a write operation, generate an error correction code (e.g., parity bits PTY) for correcting an error using a preset error correction algorithm, and transmit the generated parity bits PTY along with the write data WDATA to the memory module 120. The error correction circuit 112 may use a Reed-Solomon (RS) error correction algorithm. Typically, a Hamming error correction algorithm has been widely used. However, as an error occurrence rate in memory chips 121 to 141 included in the memory module 120 is increased, the RS error correction algorithm having error correction performance superior to that of the Hamming error correction algorithm may be used. In the RS error correction algorithm, errors may be corrected on a symbol basis.

During a read operation, the error correction circuit 112 may correct an error included in read data RDATA' outputted from the memory module 120 using parity bits PTY outputted from the memory module 120. The error correction circuit 112 may transmit error-corrected read data RDATA to the host HOST. In other words, the error correction circuit 112 may perform an error correction code (ECC) decoding operation on the read data RDATA' outputted from the memory module 120 using the parity bits PTY generated during an ECC encoding operation. The error correction circuit 112 may not be able to correct error bits of the read data RDATA' if the number of the error bits is greater than a correctable error bit limit. In this case, the error correction circuit 112 may output, to the host HOST, an error correction fail signal ECC_FAIL for informing that error correction has failed.

The memory module 120 may include the plurality of memory chips 121 to 141.

The unit of data which is processed at a time in the memory system 100 may be generally 512 bits. That is, the memory controller 110 may receive the write data WDATA transmitted from the host HOST on a 512-bit basis, and may transmit the read data RDATA to the host HOST on a 512-bit basis. When 1 symbol to be processed in the RS error correction algorithm is composed of 8 bits, each of the write data WDATA and the read data RDATA may include 64 symbols.

If the error correction performance capable of correcting [6-bit random error+chipkill of a single memory chip] is required for the memory system 100, the RS error correction algorithm should be able to correct an error of total 10 symbols including 6 symbols (on the assumption that the 6-bit random error is included in different symbols) and 4 symbols (a 32-bit data error in the single memory chip). The number of parity bits corresponding to a size of the error correction code in the RS error correction algorithm may be determined depending on the number of error-correctable symbols and be expressed by the following [Equation 1].

the number of parity bits=2*(the number of correctable symbols of a location-unknown error),   [Equation 1]

where each symbol is formed of M bits, M being an integer of 2 or more, e.g., 8.

In the case where 10 symbols are correctable, the number of parity bits is calculated using [Equation 1] as follows: the number of parity bits is 2*10 symbols=20 symbols=20*8 bits=160 bits. The number of parity bits capable of correcting [6-bit random error+chipkill of a single memory chip] generated in the memory chips 121 to 141 may be 160 bits. In this case, the memory module 120 of FIG. 1 should be configured to include 22 memory chips 121 to 141.

Each of the memory chips 121 to 141 may store 32-bit write data WDATA during a single write operation and may output 32-bit read data RDATA' during a single read operation. Therefore, 512-bit write data WDATA may be written at a time in 16 memory chips 121 to 136, or 512-bit read data RDATA' may be read from 16 memory chips 121 to 136 at a time. 160 parity bits PTY for error correction may be written in or read from 5 memory chips 137 to 141. Information stored in the memory chips 121 to 141 has been expressed in FIG. 1 as the reference numerals "DATA'" and "ECC" in the memory chips 121 to 141.

The probability of occurrence of a chipkill in a memory chip is very low. However, because the occurrence of a chipkill should be coped with, the number of parity bits is increased more than necessary, thus causing a degradation in the performance of the memory system due to an increase in latency or an increase in area. Particularly, in the case of the foregoing example, if only the random error is taken into account, 12 symbols are needed, but 20 symbols are needed to cope with even a situation of a chipkill in one memory chip. As the number of needed parity bits is increased, the number of memory chips required to store the parity bits is increased, the size of the error correction circuit for calculating the parity bits and syndrome is increased, and ECC decoding latency in a situation of no chipkill is increased.

Hereinafter, a method of detecting a location of a fail chip in which a chipkill occurs, and reducing the number of parity bits based on the location of the detected fail chip in accordance with an embodiment of the present disclosure will be described.

Figure 2:
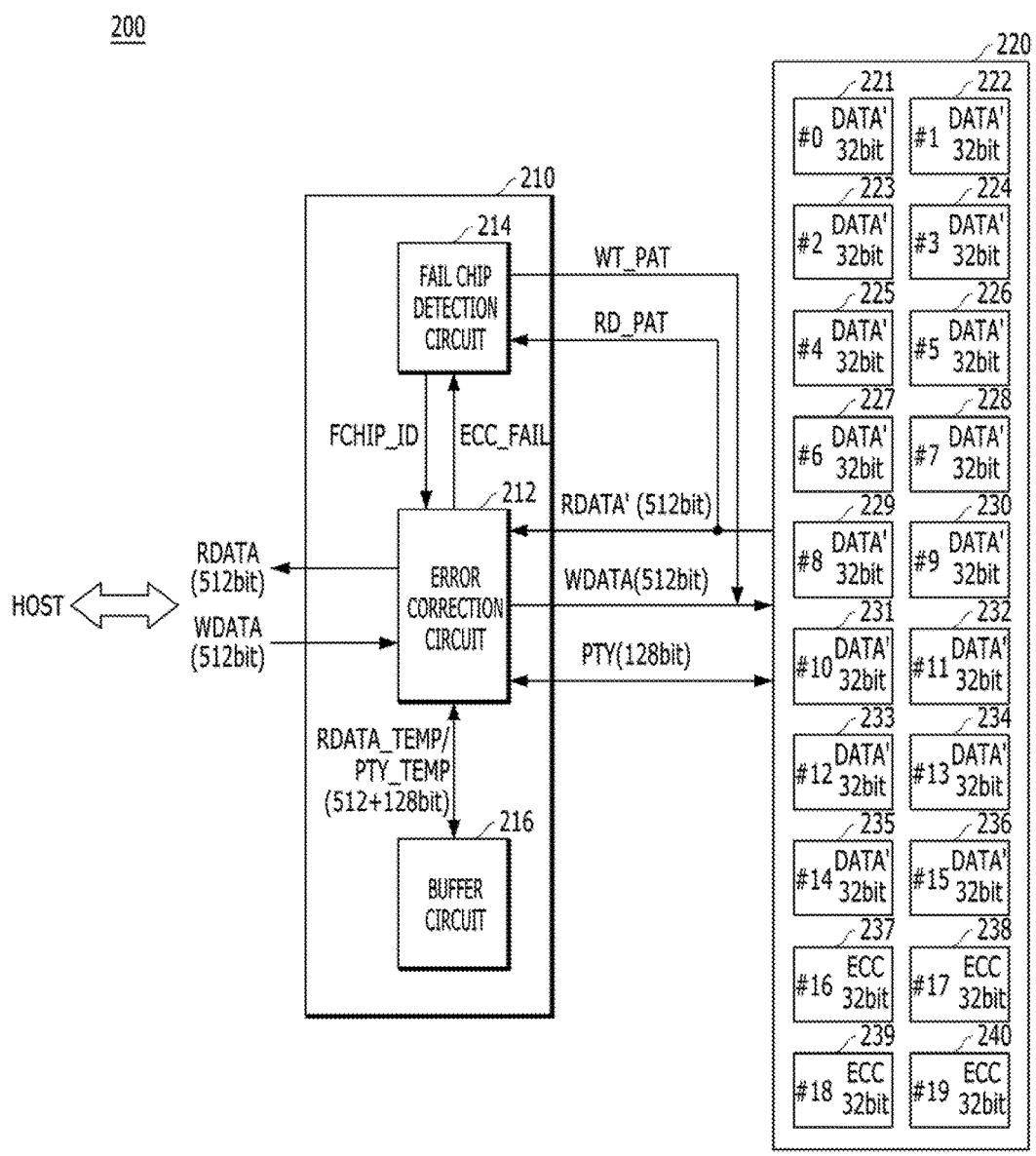
FIG. 2 is a block diagram illustrating a memory system in accordance with an embodiment of the present disclosure.

FIG. 2 is a block diagram illustrating a memory system 200 in accordance with an embodiment of the present disclosure.

In FIG. 2, there is illustrated only a portion of the memory system 200 which directly pertains to data transmission.

Referring to FIG. 2, the memory system 200 may include a memory controller 210 and a memory module 220. The memory controller 210 may control an operation such as a read or write operation of the memory module 220 in response to a request received from a host HOST. The memory module 220 may include a plurality of memory chips 221 to 240. Each of the memory chips 221 to 240 may be any one of all kinds of memories including a dynamic random access memory (DRAM), a phase change random access memory (PCRAM), a flash memory, etc. The memory module 220 may be a dual in-line memory module (DIMM) type memory module.

The memory controller 210 may include an error correction circuit 212, a fail chip detection circuit 214, and a buffer circuit 216.

The error correction circuit 212 may receive write data WDATA transmitted from the host HOST during a write operation, generate an error correction code (e.g., parity bits PTY) for correcting an error using a preset error correction algorithm, and transmit the generated parity bits PTY along with the write data WDATA to the memory module 220. The error correction circuit 212 may use a Reed-Solomon (RS) error correction algorithm, and the error correction code may include an RS error correction code. The RS error correction algorithm may correct errors on a symbol basis.

During a read operation, the error correction circuit 212 may correct an error included in read data RDATA' outputted from the memory module 220 using parity bits PTY outputted from the memory module 220. The error correct circuit 212 may transmit error-corrected read data RDATA to the host HOST. In other words, the error correction circuit 212 may perform an ECC decoding operation on the read data RDATA' outputted from the memory module 220 using the parity bits PTY generated during an ECC encoding operation. Here, if the number of the error bits is greater than a correctable error bit limit or more, the error correction circuit 212 may output, to the fail chip detection circuit 214, an error correction fail signal ECC_FAIL for informing that error correction has failed, and may temporarily store the read data RDATA' and the parity bits PTY in the buffer circuit 216 as read data RDATA_TEMP and parity bits PTY_TEMP. If the number of the error bits is equal to or less than the correctable error bit limit, the error correction circuit 212 may determine that there is no fail chip in which a chipkill has occurred, and may output the error-corrected read data RDATA to the host HOST.

When the error correction fail signal ECC_FAIL is inputted, the fail chip detection circuit 214 may detect a fail chip in which a chipkill has occurred, by writing a certain input test pattern WT_PAT in the plurality of memory chips 221 to 240 and reading an output test pattern RD_PAT written in the plurality of memory chips 221 to 240. The fail chip detection circuit 214 may provide an identification (ID) of the detected fail chip to the error correction circuit 212 as a fail chip ID FCHIP_ID. Here, the input test pattern WT_PAT may be formed of an all-zero or all-one pattern. Therefore, the fail chip detection circuit 214 may input the input test pattern WT_PAT having the all-zero pattern or the all-one pattern to the plurality of memory chips 221 to 240, read the output test pattern RD_PAT therefrom, and thus detect the fail chip depending on a result of comparison between the input test pattern WT_PAT and the output test pattern RD_PAT.

The error correction circuit 212 in accordance with the embodiment may recorrect an error of the read data RDATA_TEMP stored in the buffer circuit 216 using the parity bits PTY_TEMP stored in the buffer circuit 216 based on the fail chip ID FCHIP_ID, and rewrite the error-corrected read data RDATA' and the parity bits PTY in the plurality of memory chips 221 to 240.

If the unit of data which is processed at a time in the memory system 200 is 512 bits, the memory controller 110 may receive the write data WDATA transmitted from the host HOST on a 512-bit basis, and may transmit the read data RDATA to the host HOST on a 512-bit basis. When 1 symbol to be processed in the RS error correction algorithm is 8 bits, each of the write data WDATA and the read data RDATA may include 64 symbols.

As described above, in an example, where an error correction performance capable of correcting [6-bit random error+chipkill of a single memory chip] is required for the memory system 200, the number of parity bits may be 20 symbols, i.e., 160 bits. However, if a fail chip in which a chipkill has occurred has been known, among the plurality of memory chips 221 to 240, in other words, when the location of the chipkill has been known, the number of parity bits may be reduced. In the case where a location-known error and a location-unknown error are present together, the number of parity bits corresponding to a size of the error correction code in the RS error correction algorithm may be expressed by the following [Equation 2].

The number of parity bits=2*(the number of correctable symbols of the location-unknown error)+(the number of correctable symbols of the location-known error),    [Equation 2]

where each symbol is formed of M bits, M being an integer of 2 or more, e.g., 8.

The number of parity bits for correcting [6-bit random error correction+chipkill error correction in the case where the fail chip has been known] is calculated using [Equation 2] as follows: the number of parity bits is 2*(6 symbols)+(4 symbols)=16 symbols, i.e., 128 bits. In other words, as shown in FIG. 2, the error correction circuit 212 may generate the 128 parity bits PTY having a size capable of correcting the 6-bit random error and one location-known chipkill.

Each of the memory chips 221 to 240 may store 32-bit write data WDATA during a single write operation and may output 32-bit read data RDATA' during a single read operation. Therefore, 512-bit write data WDATA may be written at a time in 16 memory chips 221 to 236, or 512-bit read data RDATA' may be read from 16 memory chips 221 to 236 at a time. 128 parity bits PTY for error correction may be written in or read from 4 memory chips 237 to 240. Information stored in the memory chips 221 to 240 has been expressed in FIG. 2 as the reference numerals "DATA" and "ECC" in the memory chips 221 to 240. In addition, the reference numerals from "#0" to "#19" have been used to distinguish the memory chips 221 to 240 from each other.

The pattern in which the write data WDATA, the read data RDATA', and the parity bits PTY are distributed to the memory chips 221 to 240 does not necessarily need to be the same as that of FIG. 2. The write data WDATA, the read data RDATA', and the parity bits PTY have only to be distributed to and stored in the memory chips 221 to 240.

In FIG. 2, there is illustrated an example in which the error correction circuit 212, the fall chip detection circuit 214, and the buffer circuit 216 are included in the memory controller 210, but we note that, in another embodiment, some of them may be included in the memory module 220. Also, the number of memory modules 220 may differ from that of FIG. 2, and the number of bits of write data WDATA, read data RDATA', and parity bits PTY may differ from those of FIG. 2.

Further, in FIG. 2, there is illustrated as an example a case where each symbol is formed of 8 bits, however, in other embodiments a symbol may not be formed of 8 bits, for example, each symbol may be formed of 7 or 6 bits, and, hence, the number of parity bits may differ from that of the example of FIG. 2.

As described above, in the memory system 200 in accordance with the embodiment of the present disclosure, in the case where an error correction operation has failed using a less number of parity bits PTY compared to that of the memory system 100 of FIG. 1, a fail chip in which a chipkill has occurred may be detected, and the error may be corrected based on the detected fail chip ID FCHIP_ID. Therefore, the memory system 200 in accordance with the embodiment of the present disclosure may reduce the size of the ECC circuit and the ECC decoding latency despite having the same error correction performance as that of the typical memory system 100.

Furthermore, the memory module 220 in accordance with the embodiment of the present disclosure includes 16 memory chips 221 to 236 for storing read data/write data on a 512-bit basis and 4 memory chips 237 to 240 for storing 128 parity bits for error correction of the read data/write data. On the other hand, the typical memory module 120 has to include 21 memory chips 121 to 141 to input/output data on the same basis as that of the embodiment of the present disclosure. Consequently, the memory system 200 in accordance with the embodiment of the present disclosure may reduce the area of the circuit related to error correction despite having the same error correction performance as that of the typical memory system.

Hereinafter, a configuration of the error correction circuit 212 using the RS error correction algorithm will be described with reference to FIG. 3.

Figure 3:
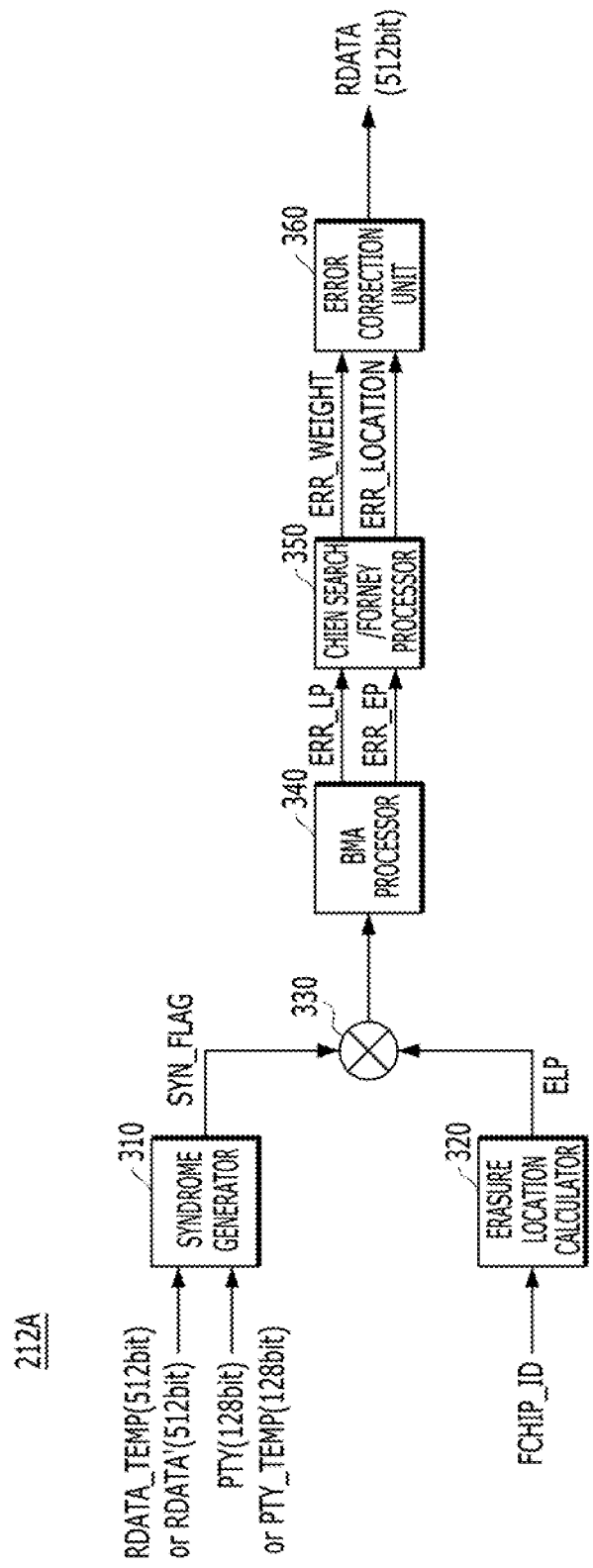
FIG. 3 is a block diagram illustrating an error correction circuit shown in FIG. 2.

FIG. 3 is a block diagram illustrating the error correction circuit 212 of FIG. 2. In particular, FIG. 3 shows a decoding-related configuration 212A of the error correction circuit 212 of FIG. 2.

Referring to FIG. 3, the error correction decoding circuit 212A may include a syndrome generator 310, an erasure location calculator 320, a multiplier 330, a Berlerkamp-Massey algorithm (BMA) processor 340, a Chien search/Forney algorithm processor 350, and an error correction unit 360.

The syndrome generator 310 may calculate a syndrome from read data RDATA' using parity bits PTY, and output a syndrome flag SYN_FLAG. The 512-bit read data RDATA' and the 128 parity bits PTY are read from the memory module 220 of FIG. 2. Otherwise, the syndrome generator 310 may calculate a syndrome from read data RDATA_TEMP using parity bits PTY_TEMP, and output a syndrome flag SYN_FLAG. The 512-bit read data RDATA_TEMP and the 128 parity bits PTY_TEMP are stored in the buffer circuit 216 of FIG. 2.

The erasure location calculator 320 may generate an erasure location polynomial ELP for determining a location of an erasure symbol based on a fail chip ID FCHIP_ID provided from the fail chip detection circuit 214 of FIG. 2. When no fail chip ID FCHIP_ID is inputted, the erasure location calculator 320 may generate an erasure location polynomial ELP based on the fail chip ID FCHIP_ID having a default value. However, in an embodiment of the present disclosure, the ECC decoding latency may be reduced because the erasure location polynomial ELP is generated based on the fall chip ID FCHIP_ID detected from the fail chip detection circuit 214.

The multiplier 330 may output a modified syndrome by multiplying the erasure location polynomial ELP by the syndrome flag SYN_FLAG.

The BMA processor 340 may calculate and output, using the modified syndrome, a coefficient of an error location polynomial ERR_LP for determining the location of an error, and a coefficient of an error evaluation polynomial for determining a weight of the error.

The Chien search/Forney algorithm processor 350 may calculate an error location ERR_LOCATION based on the error location polynomial ERR_LP and the error evaluation polynomial ERR_EP, and calculate an error weight ERR_WEIGHT at the calculated error location ERR_LOCATION.

The error correction unit 360 may output an error-corrected read data RDATA by removing the error from the read data RDATA' using the error location ERR_LOCATION and the error weight ERR_WEIGHT.

As described above, the error correction circuit 212 in accordance with the embodiment of the present disclosure may reduce the size of the ECC circuit and the ECC decoding latency, using the location of a fail chip in which a chipkill has occurred, despite having the same error correction performance as that of the typical memory system.

Hereinbelow, an operation of the memory system in accordance with an embodiment of the present disclosure will be described with reference to FIGS. 2 to 4.

Figure 4:
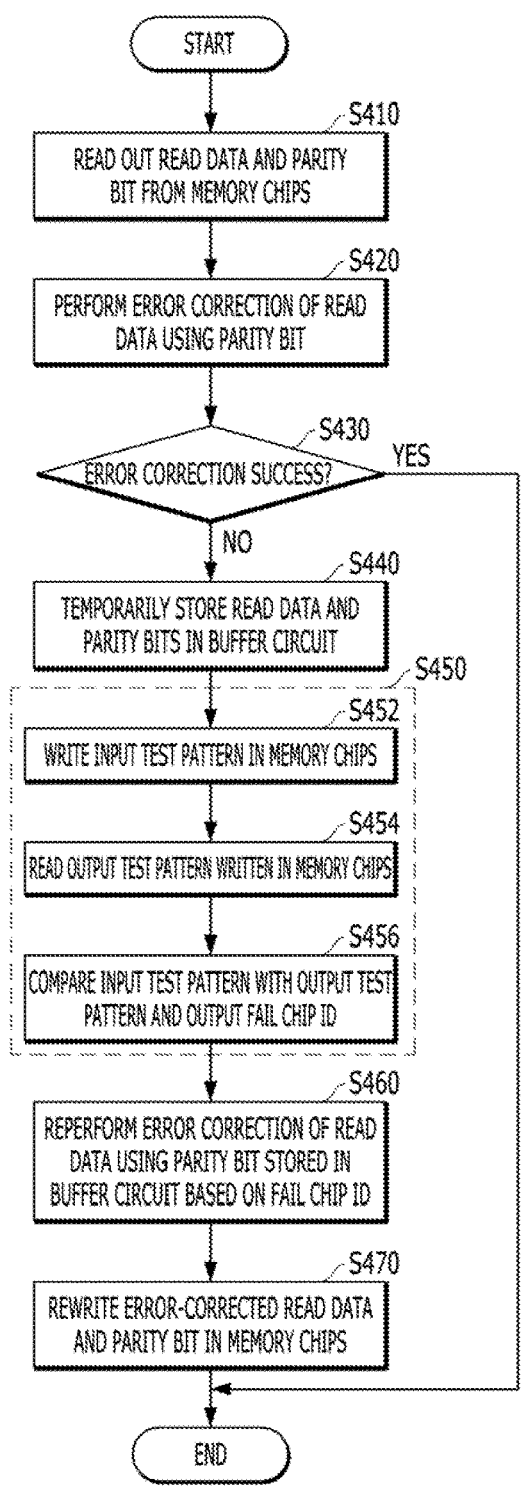
FIG. 4 is a flowchart for describing an operation of a memory system in accordance with an embodiment of the present disclosure.

FIG. 4 is a flowchart for describing an operation of the memory system in accordance with an embodiment of the present disclosure.

Referring to FIG. 4, read data RDATA' and parity bits PTY may be read from the plurality of memory chips 221 to 240, at step S410. The 512-bit read data RDATA' and the 128 parity bits PTY may be transmitted to the memory controller 210.

The error correction circuit 212 may correct an error of the read data RDATA' using the parity bits PTY, at step S420. Here, in accordance with an embodiment of the present disclosure, the number of parity bits may be [2*(the number of correctable symbols of a location-unknown error)+(the number of correctable symbols of a location-known error)]. For example, in the case where it is possible for the memory system 200 to correct errors by [a 6-bit random error occurring in a plurality of memory chips+a single chipkill error], the number of parity bits becomes 2*(6 symbols)+(4 symbols)=16 symbols, i.e., 128 bits.

In detail, the error correction circuit 212 may generate a syndrome flag SYN_FLAG by calculating a syndrome from the read data RDATA' using the parity bits PTY read from the plurality of memory chips 221 to 240, generate an erasure location polynomial ELP for determining a location of an erasure symbol based on a fail chip ID FCHIP_ID having a default value, output a modified syndrome by multiplying the syndrome flag SYN_FLAG by the erasure location polynomial ELP, calculate a coefficient of an error location polynomial ERR_LP and a coefficient of an error evaluation polynomial ERR_EP using the modified syndrome, calculate an error location ERR_LOCATION based on the error location polynomial ERR_LP and the error evaluation polynomial ERR_EP, calculate an error weight ERR_WEIGHT at the calculated error location ERR_LOCATION, and correct the error of the read data RDATA' based on the error location ERR_LOCATION and the error weight ERR_WEIGHT.

If the error correction operation has succeeded ('YES' at step S430), in other words, if the number of error bits of the read data RDATA' is within the correctable error bit limit, the error correction circuit 212 may determine that there is no fail chip in which a chipkill has occurred, and may output an error-corrected read data RDATA to the host, thus terminating the error correction operation.

The number of parity bits which are used in the memory system 200 is 128 which is less than 160 that is the number of parity bits which are used in the typical memory system 100. Hence, in the case where the 6-bit random error and the chipkill of one memory chip occur, the error correction operation may fail ('NO' at step S430).

If the error correction operation has failed ('NO' at step S430), in other words, if the number of error bits exceeds the correctable error bit limit, the error correction circuit 212 may output, to the fail chip detection circuit 214, an error correction fail signal ECC_FAIL for informing that the error correction has failed, and may temporarily store the read data RDATA' and the parity bits PTY in the buffer circuit 216 as read data RDATA_TEMP and parity bits PTY_TEMP.

If the error correction fall signal ECC_FAIL is inputted, the fail chip detection circuit 214 may detect a fail chip in which the chipkill has occurred, at step S450. In more detail, the fail chip detection circuit 214 may write a certain input test pattern WT_PAT including an all-zero pattern or an all-one pattern in the plurality of memory chips 221 to 240, at step S452, may read an output test pattern RD_PAT written in the plurality of memory chips 221 to 240, at step S454, and then may detect the fail chip depending on a result of comparison between the input test pattern WT_PAT and the output test pattern RD_PAT. The fail chip detection circuit 214 may provide an ID of the detected fail chip to the error correction circuit 212 as the fail chip ID FCHIP_ID, at step S456.

The error correction circuit 212 may recorrect, based on the fail chip ID FCHIP_ID, the error of the read data RDATA_TEMP stored in the buffer circuit 216 using the parity bits PTY_TEMP stored in the buffer circuit 216, at step S460.

In detail, the error correction circuit 212 may generate the syndrome flag SYN_FLAG by calculating the syndrome from the read data RDATA_TEMP stored in the buffer circuit 216 using the parity bits PTY_TEMP stored in the buffer circuit 216, generate the erasure location polynomial ELP for determining the location of the erasure symbol based on the fail chip ID FCHIP_ID provided from the fail chip detection circuit 214, output the modified syndrome by multiplying the syndrome flag SYN_FLAG by the erasure location polynomial ELP, calculate the coefficient of the error location polynomial ERR_LP and the coefficient of the error evaluation polynomial ERR_EP using the modified syndrome, calculate the error location ERR_LOCATION based on the error location polynomial ERR_LP and the error evaluation polynomial ERR_EP, calculate the error weight ERR_WEIGHT at the calculated error location ERR_LOCATION, and correct the error of the read data RDATA_TEMP based on the error location ERR_LOCATION and the error weight ERR_WEIGHT.

The error correction circuit 212 may rewrite the error-corrected read data and the parity bits in the plurality of memory chips 221 to 240, at step S470.

If the error of the read data RDATA' has not been corrected even after the error correction operation has been performed again, this indicates that the number of error bits is greater than that of [6-bit random error+chipkill of one memory chip], and the error correction fails.

In the embodiment, there has been illustrated an example in which the error correction circuit, the fail chip detection circuit, and the buffer circuit are included in the memory controller, they may be included in the memory module.

Figure 5:
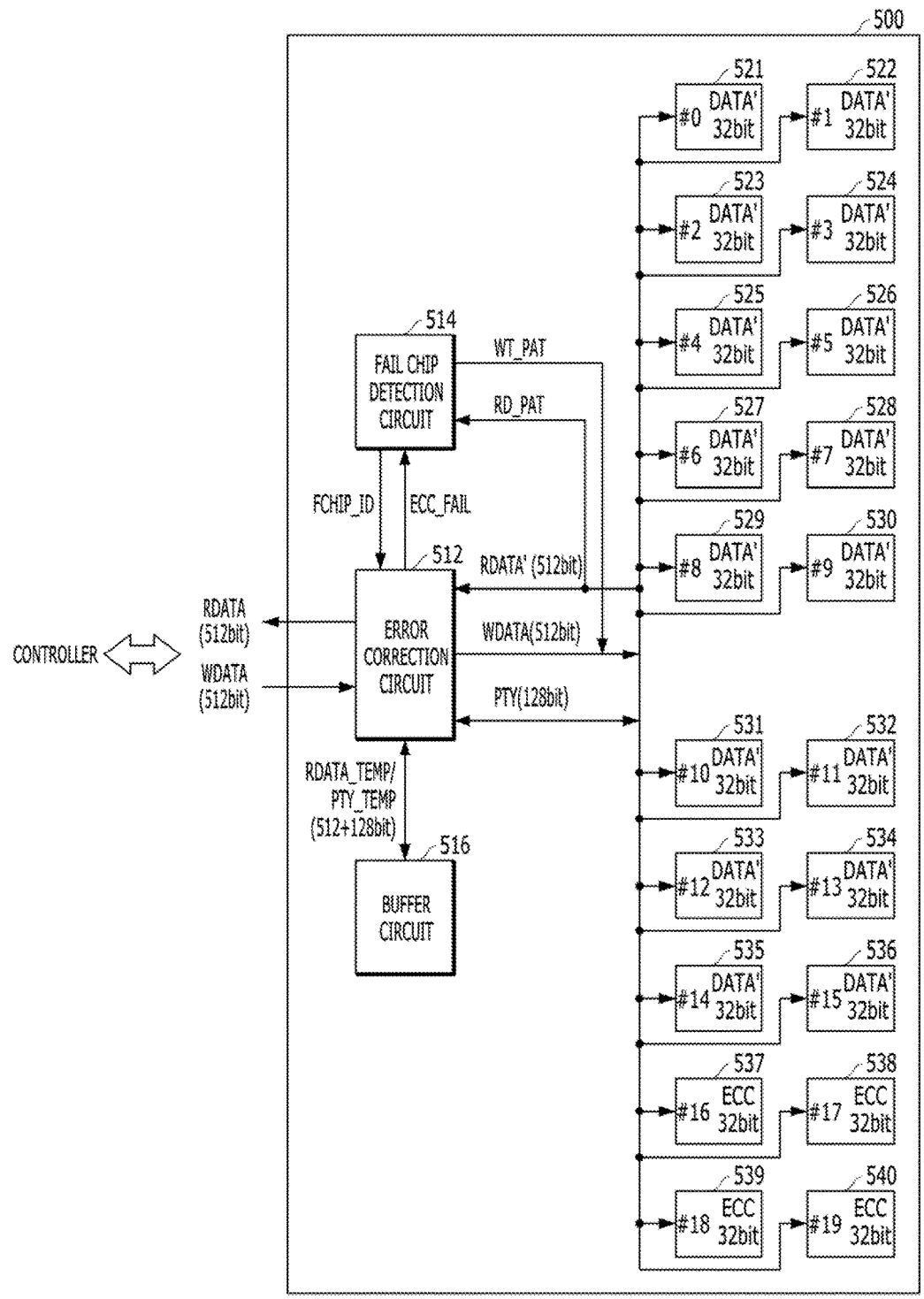
FIG. 5 is a diagram illustrating a memory module in accordance with an embodiment of the present disclosure.

FIG. 5 is a diagram illustrating a memory module 500 in accordance with an embodiment of the present disclosure.

In FIG. 5, there has been illustrated only portions needed to describe this embodiment.

Referring to FIG. 5, the memory module 500 may include an error correction circuit 512, a fail chip detection circuit 514, a buffer circuit 516, and a plurality of memory chips 521 to 540. The memory module 500 may be a dual in-line memory module (DIMM) type memory module, and may receive a control signal (not shown) and write data WDATA from an external memory controller (not shown) during a write operation of the memory chips 521 to 540, and output read data to the memory controller during a read operation of the memory chips 521 to 540. Each of the memory chips 521 to 540 may be any one of all kinds of memories including a dynamic random access memory (DRAM), a phase change random access memory (PCRAM), a flash memory, etc.

The error correction circuit 512, the fail chip detection circuit 514, the buffer circuit 516, and the plurality of memory chips 521 to 540 of FIG. 5, except for a structure in which they are disposed in the memory module 500 rather than being disposed in the memory controller, may have substantially the same configurations as those of the error correction circuit 212, the fail chip detection circuit 214, the buffer circuit 216, and the plurality of memory chips 221 to 240 of FIG. 2. In an embodiment, each of the error correction circuit 512, the fail chip detection circuit 514, and the buffer circuit 516 may be formed of a memory buffer or a registered clock driver (RCD).

As described above, in the memory module 500 in accordance with this embodiment, in the case where an error correction operation has failed, a fail chip in which a chipkill has occurred is detected, and the error may be recorrected based on a fail chip ID FCHIP_ID. Therefore, the memory system 200 in accordance with the embodiment may reduce the size of the ECC circuit and the ECC decoding latency despite having the same error correction performance as that of the typical memory system 100.

A memory system in accordance with various embodiments may determine the location of a fail chip in which a chipkill has occurred, so that the efficiency in error correction may be enhanced.

A memory system in accordance with various embodiments may reduce the number of parity bits despite having the same error correction performance as that of a typical memory system. Therefore, there is an advantage in that the size of an ECC circuit and ECC decoding latency may be reduced.

Although various embodiments have been described for illustrative purposes, it will be apparent to those skilled in the art that various changes and modifications may be made without departing from the spirit and scope of the disclosure as defined in the following claims.

What is claimed is:

1. An error correcting method of a memory system, comprising:
    reading read data and an error correction code from a plurality of memory chips;
    correcting an error of the read data using the error correction code;
    temporarily storing the read data and the error correction code in a buffer if the correcting of the error fails;
    writing a certain input test pattern in the plurality of memory chips, reading an output test pattern written in the plurality of memory chips, and detecting a fail chip in which a chipkill occurs based on a result of comparison between the input test pattern and the output test pattern;
    recorrecting, based on a location of the detected fail chip, the error of the read data stored in the buffer using the error correction code stored in the buffer; and
    rewriting error-corrected read data and the error correction code in the plurality of memory chips.

2. The error correcting method of claim 1, wherein the recorrecting of the error of the read data stored in the buffer comprises:

generating a syndrome flag by calculating a syndrome from the read data stored in the buffer using the error correction code stored in the buffer;

generating an erasure location polynomial for determining a location of an erasure symbol based on the location of the detected fail chip;

outputting a modified syndrome by multiplying the syndrome flag by the erasure location polynomial;

calculating a coefficient of an error location polynomial and a coefficient of an error evaluation polynomial using the modified syndrome;

calculating a location of the error from the error location polynomial and the error evaluation polynomial, and calculating a weight of the error at the calculated location of the error; and correcting the error of the read data stored in the buffer based on the location of the error and the weight of the error.

3. The error correcting method of claim 1, wherein the error correction code is a Reed-Solomon error correction code.

4. The error correcting method of claim 1, wherein the memory system corrects the error including N-bit random error occurring in the plurality of memory chips and one chipkill error, where N is an integer of 1 or more.

5. The error correcting method of claim 1, wherein a number of bits of the error correction code is determined by [2*(a number of correctable symbols of a location-unknown error)+(a number of correctable symbols of a location-known error)], where each of the correctable symbols is formed of M bits, M being an integer of 2 or more.

6. The error correcting method of claim 1, wherein, when the correcting of the error succeeds, it is determined that the fail chip is not present, and the correcting of the error is terminated.

7. The error correcting method of claim 1, wherein the certain input test pattern includes an all-zero pattern or an all-one pattern.

8. A memory system comprising:
a plurality of memory chips suitable for storing data and an error correction code;
an error correction circuit suitable for correcting an error of the data read from the plurality of memory chips using the error correction code read from the plurality of memory chips, and temporarily storing the read data and the error correction code in a buffer if the correction of the error fails; and
a fail chip detection circuit suitable for writing a certain input test pattern in the plurality of memory chips, reading an output test pattern written in the plurality of memory chips, and detecting a fail chip in which a chipkill occurs based on a result of comparison between the input test pattern and the output test pattern, if the correction of the error fails,
wherein the error correction circuit recorrects, based on a location of the detected fail chip, the error of the read data stored in the buffer using the error correction code stored in the buffer, and rewrites error-corrected read data and the error correction code in the plurality of memory chips.

9. The memory system of claim 8, wherein the error correction circuit comprises:
a syndrome generator suitable for generating a syndrome flag by calculating a syndrome from the read data using the error correction code;
an erasure location calculator suitable for generating an erasure location polynomial for determining a location of an erasure symbol based on the location of the detected fail chip;
a multiplier suitable for outputting a modified syndrome by multiplying the syndrome flag by the erasure location polynomial;
a Berlekamp-Massey algorithm processor suitable for calculating a coefficient of an error location polynomial and a coefficient of an error evaluation polynomial using the modified syndrome;
a Chien search/Forney algorithm processor suitable for calculating a location of the error from the error location polynomial and the error evaluation polynomial, and calculating a weight of the error at the calculated location of the error; and
an error correction unit suitable for correcting the error of the read data based on the location of the error and the weight of the error.

10. The memory system of claim 8, wherein the error correction circuit uses a Reed-Solomon error correction algorithm.

11. The memory system of claim 8, wherein the memory system corrects the error including N-bit random error occurring in the plurality of memory chips and one chipkill error, where N is an integer of 1 or more.

12. The memory system of claim 8, wherein a number of bits of the error correction code is determined by [2*(a number of correctable symbols of a location-unknown error)+(a number of correctable symbols of a location-known error)], where each of the correctable symbols is formed of M bits, M being an integer of 2 or more.

13. The memory system of claim 8, wherein, when the correcting of the error succeeds, the error correction circuit determines that the fail chip is not present, and terminates the correcting of the error.

14. The memory system of claim 8, wherein the certain input test pattern includes an all-zero pattern or an all-one pattern.

15. The memory system of claim 8,
wherein the error correction circuit and the fail chip detection circuit are included in a memory controller, and
wherein the plurality of memory chips are included in a memory module.

16. A memory module comprising:
a plurality of memory chips suitable for storing data and an error correction code;
an error correction circuit suitable for correcting an error of the data read from the plurality of memory chips using the error correction code read from the plurality of memory chips, and temporarily storing the read data and the error correction code in a buffer if the correction of the error fails; and
a fail chip detection circuit suitable for writing a certain input test pattern in the plurality of memory chips, reading an output test pattern written in the plurality of memory chips, and detecting a fail chip in which a chipkill occurs based on a result of comparison between the input test pattern and the output test pattern, if the correction of the error fails,
wherein the error correction circuit recorrects, based on a location of the detected fail chip, the error of the read data stored in the buffer using the error correction code stored in the buffer, and rewrites error-corrected read data and the error correction code in the plurality of memory chips.

17. The memory module of claim 16, wherein the error correction circuit uses a Reed-Solomon error correction algorithm.

18. The memory module of claim 16, wherein the memory module corrects the error including N-bit random error occurring in the plurality of memory chips and one chipkill error, where N is an integer of 1 or more.

19. The memory module of claim 16, wherein a number of bits of the error correction code is determined by [2*(a number of correctable symbols of a location-unknown error)+(a number of correctable symbols of a location-known error)], where each of the correctable symbols is formed of M bits, M being an integer of 2 or more.

20. The memory module of claim 16, wherein the certain input test pattern includes an all-zero pattern or an all-one pattern.

* * * * *